US006642489B2

(12) United States Patent
Ramaswamy et al.

(10) Patent No.: US 6,642,489 B2
(45) Date of Patent: Nov. 4, 2003

(54) METHOD AND APPARATUS FOR IMPROVING EXHAUST GAS CONSUMPTION IN AN EXHAUST CONDUIT

(75) Inventors: Kartik Ramaswamy, Santa Clara, CA (US); Dennis S. Grimard, Ann Arbor, MI (US); Philip M. Salzman, San Jose, CA (US); Liang-Guo Wang, Milpitas, CA (US); Kwok Manus Wong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/758,000

(22) Filed: Jan. 9, 2001

(65) Prior Publication Data

US 2002/0088797 A1 Jul. 11, 2002

(51) Int. Cl.[7] .................................................. H05B 6/10
(52) U.S. Cl. ....................... 219/634; 219/635; 118/724; 118/725
(58) Field of Search .................. 219/634, 635, 219/390, 638; 118/725, 724; 432/241, 11, 253; 165/144, 145, 52, 158; 126/524, 502; 123/545, 543, 546; 392/488, 489, 485

(56) References Cited

U.S. PATENT DOCUMENTS

| 4,167,165 A | * | 9/1979 | Finlay et al. ................ 123/545 |
| 4,269,590 A | * | 5/1981 | Baumanns ................... 431/210 |
| 5,450,721 A | * | 9/1995 | Golben et al. ................ 60/274 |
| 5,489,319 A | * | 2/1996 | Tokoda et al. ................ 96/400 |
| 5,928,428 A | * | 7/1999 | Horie .......................... 118/724 |

FOREIGN PATENT DOCUMENTS

| JP | 05263627 | * | 10/1993 |
| JP | 09027458 | * | 1/1997 |

* cited by examiner

*Primary Examiner*—Quang T. Van
(74) *Attorney, Agent, or Firm*—Moser, Patterson, & Sheridan; Joseph Bach

(57) ABSTRACT

A conduit has a heating system disposed therein. The heating system generates heat in response to magnetic flux generated by an inductive coil. The heating system has a heat transfer element and a plurality of ferromagnetic elements. The heat transfer element may be displaced within the conduit to control the amount of heat generated.

39 Claims, 3 Drawing Sheets

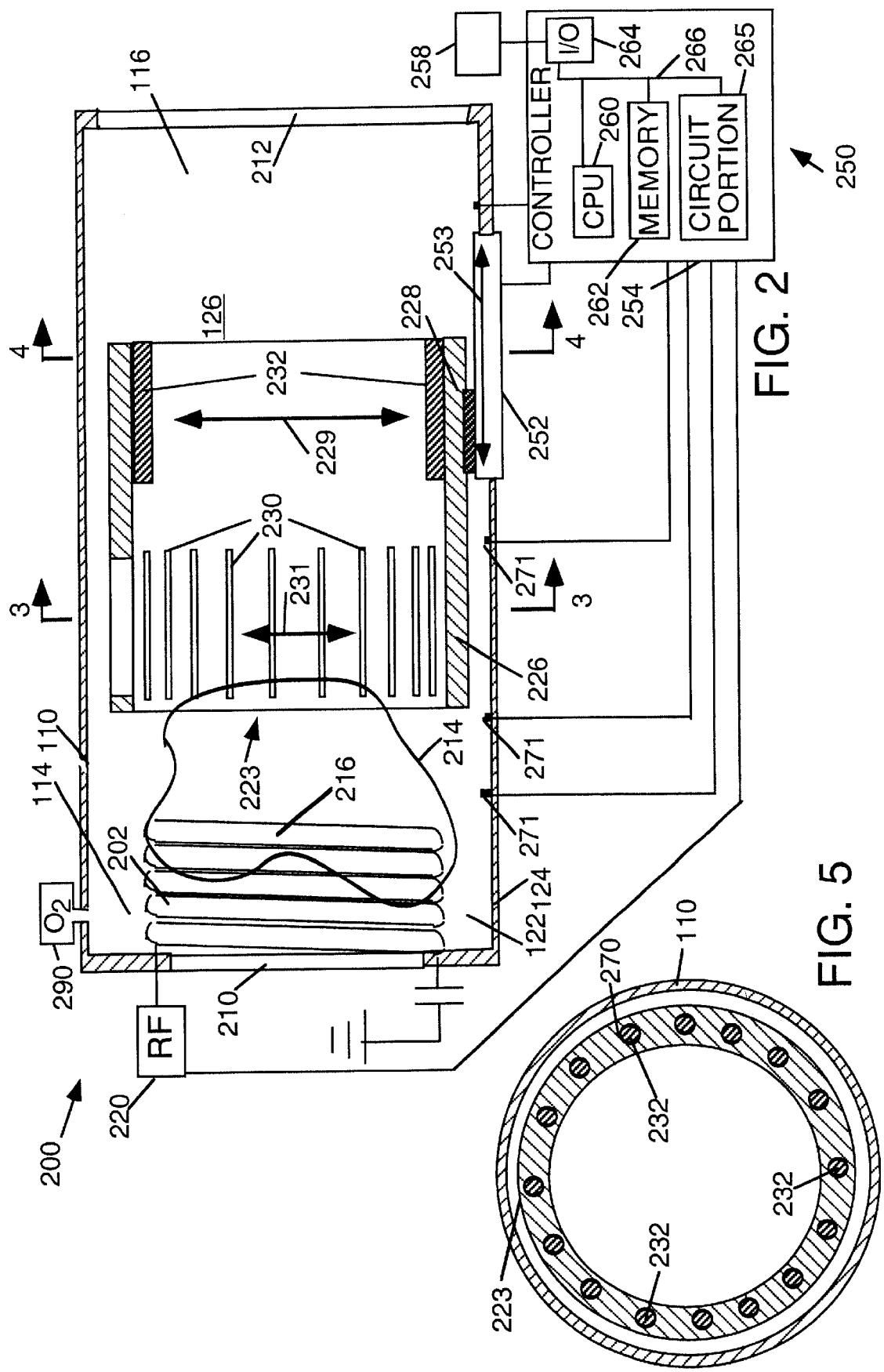

METHOD AND APPARATUS FOR IMPROVING EXHAUST GAS CONSUMPTION IN AN EXHAUST CONDUIT

BACKGROUND OF THE INVENTION

1. Field of the Invention

The invention relates to a heat transfer device. More particularly, the invention relates to a heat transfer device to be used in an exhaust conduit of a semiconductor fabrication device.

2. Description of the Prior Art

Physical vapor deposition (PVD), chemical vapor deposition (CVD), ion implantation, certain etching processes, and certain metal deposition processes are examples of plasma assisted semiconductor fabrication processes. A plasma is initiated and maintained within a semiconductor process chamber by applying a high power electric field to a semiconductor process chamber. The plasma (typically characterized by a visible glow) is a mixture comprising neutrons, electrons, positive ions, and/or negative ions. The plasma either deposits material on, or etches material from, a substrate contained within the semiconductor process chamber. The substrate may be a semiconductor wafer, a light emitting diode (LED) display screen, or any of a variety of known substrates.

Plasmas for substrate processing are generated and sustained under a variety of vacuum, temperature, magnetic, and electric conditions. A variety of gases may be input into the semiconductor process chamber to ignite and maintain the plasma. The process consumes a large percentage, but not all, of the gases and generates an effluent comprising unconsumed gases, consumed gas by-products, and other by-products of the process. Additionally, semiconductor process chambers are provided with multiple exhaust pumps often arranged serially to create the vacuum process environment within the semiconductor process chamber. The multiple exhaust pumps remove the effluent from the semiconductor process chamber. An exhaust conduit extends between the two exhaust pumps. If the gases passing through the exhaust conduit are not at a sufficient temperature, then the unconsumed gases are not completely oxidized (or otherwise converted into an acceptable form) in the exhaust conduit. For example, perfluorocarbons (PFC) are by-products of certain processes. Purely thermal reactions between PFCs such as $C_2F_6$, $CF_4$, and $C_4F_8$ and oxygen molecules require temperatures below 1500° K in the absence of a plasma. A considerable amount of energy must be continually supplied to the exhaust conduit to raise its temperature to a level sufficient to perform such a thermal reaction.

It would be desirable to provide a system by which the exhaust conduit wall and the gasses passing through the exhaust conduit can be heated more rapidly and maintained at a higher temperature to enhance the consumption of unconsumed gasses, or effluents.

SUMMARY OF THE INVENTION

Many of the disadvantages associated with the prior art are overcome with the present method and apparatus configured to be disposed within a conduit including a heating element. The heating element generates heat in response to magnetic flux generated by an inductive coil. The heating element comprises a heat liner attached to a plurality of ferromagnetic elements. The heating element may be displaced within the conduit to control the amount of heat generated by the heating element.

The heating element has been found especially applicable in situations where considerable variations exist in the temperature of the interior of a semiconductor process chamber and other process system components (i.e., conduits). Such other components can be heated to more completely consume effluents thereby reducing dangerous process by-products.

BRIEF DESCRIPTION OF THE DRAWINGS

The teachings of the present invention can be readily understood by considering the following detailed description in conjunction with the accompanying drawings, in which:

FIG. 2 shows a partial cross sectional view of a conduit of an exhaust system having a heating system of one embodiment of the present invention;

FIG. 5 shows a cross sectional view of an alternate embodiment of the heating system of the present invention, as taken through section lines 4—4 of FIG. 2.

To facilitate understanding, identical reference numerals have been used, where possible, to designate identical elements that are common to the figures.

DETAILED DESCRIPTION

After considering the following description, those skilled in the art will realize that the teachings of the invention can be readily utilized in many applications where heated conduits and conduit walls are desired.

Figure 1:
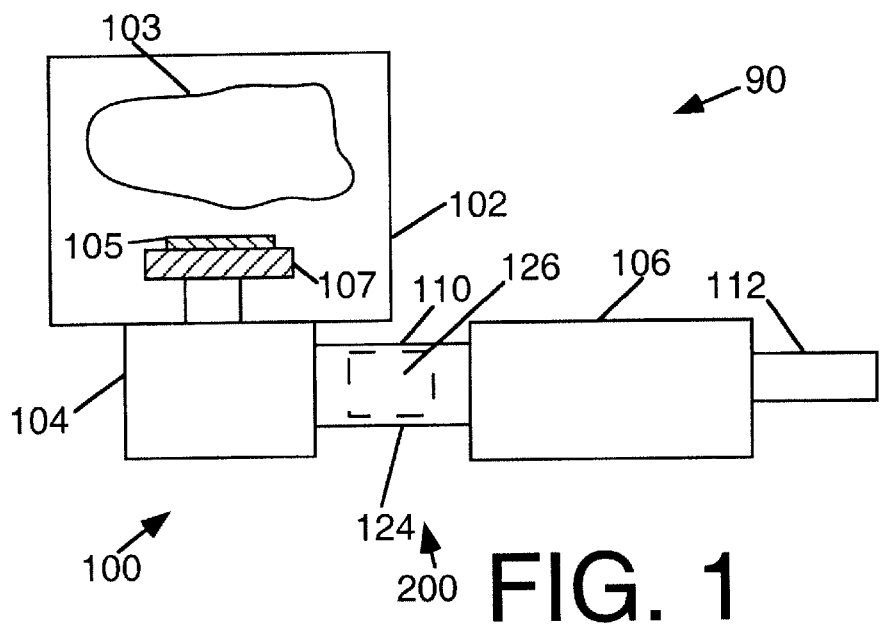
FIG. 1 shows a cross-sectional view of one embodiment of a semiconductor process chamber in communication with an exhaust system.

FIG. 1 shows a semiconductor process chamber 102 fluidly coupled to an exhaust system 100. The exhaust system 100 comprises a plurality of pumps 104, 106 arranged in series, and fluidly connected by an exhaust conduit 110. A heat system 200 is positioned within the exhaust conduit 110, and controllably applies heat the gases that exist within the exhaust conduit 110. The heat system 200 also transfers heat to conduit walls 124 that define the outer periphery of the exhaust conduit 110. The generation of heat by the heat system, as well as the distribution of the heat within the exhaust conduit, enhances the consumption of the unconsumed gasses and other effluents that are dispelled from the semiconductor process chamber 102. The operation and structure of one embodiment of a plasma processing system 90, comprising the exhaust conduit 110, is now described.

The semiconductor process chamber 102 may be any known type of semiconductor process chamber that exhausts effluents. An example of a semiconductor process chamber 102 in which the present concepts may be applied is an oxide chamber. Such oxide chambers are typically used to etch $SiO_2$ from the surface of semiconductor substrate. Different semiconductor process chambers are capable of such different processes as etching, metal deposition, chemical vapor deposition, or physical vapor deposition, and the teachings of the present invention may be applied to these chambers. The semiconductor process chamber 102 comprises a pedestal 107 that supports a substrate 105. The pedestal is disposed within the semiconductor process chamber in a known manner to permit loading, processing, and removal of the substrate from the semiconductor process chamber. A plasma 103 is generated by injecting of one or more gases to the semiconductor process chamber 102 and applying a vacuum in addition to a high power electric and/or magnetic field to the semiconductor process chamber. The plasma 103 is used to process the substrate 105. The vacuum created within the semiconductor process chamber 102 is sufficient to establish and maintain process conditions, for example, 60 to 100 mtorr.

The exhaust system 100 includes first series pump 104, second series pump 106, and exhaust conduit 110. In one embodiment, the first series pump 104 is fashioned as a turbomolecular pump while the second series pump 106 is fashioned as a mechanical pump. The first series pump 104 or the second series pump 106 may be these or other known types of pumps (including cryogenic pumps). Exhaust conduit 110 connects first series pump 104 to the second series pump 106. The exhaust from the second series pump 106 is vented to atmosphere via exhaust port 112. The first series pump 104 and the second series pump 106 interact to create a vacuum within the semiconductor process chamber that is sufficient to remove unconsumed gasses and by-products from the semiconductor process chamber 102.

An abatement device consumes particulate matter such as PFCs, unconsumed gasses, and other similar effluents. The effluent, including unconsumed gasses passing from the semiconductor process chamber via first series pump 104, typically contains many underutilized PFCs that are injected into exhaust conduit 110. Such underutilized PFCs may recombine causing them to be more resistant to being abated. The semiconductor process chamber 102 has a much larger volume than the exhaust conduit 110. Therefore, gasses can be concentrated as they are exhausted through the exhaust conduit 110, providing a location to consume and/or abate such gasses.

FIG. 2 shows a detailed cross-sectional view of one embodiment of a heating system 200 disposed within the exhaust conduit 110. The exhaust conduit includes the conduit wall 124 that encases a heat transfer element 223. The heating system 200 comprises an inductive heating antenna 202, a gas inlet 210 in fluid communication with first series pump 104, a gas outlet 212 in fluid communication with second series pump 106, an oxygen supply 290, and the heat transfer element 223. When reading the following specification, FIGS. 1 and 2 should thus be viewed and considered together. The inductive heating antenna 202 comprises a coil having a plurality of inductive turns 216 electrically connected between a RF power supply 220 and ground. A capacitor is positioned between the inductive heating antenna 202 and ground.

The heat transfer element 223 is formed with a plurality of slots 230 and is a generally cylindrical body. The heat transfer element 223 may be moved axially within the exhaust conduit 110 along the direction indicated by arrow 253. A shifter device 252 is mechanically coupled to the heat transfer element 223 and controls the position of the heat transfer element 223 within the exhaust conduit 110. A heat generation control unit 250, described below, controls the positioning of the heat transfer element 223, and this controls the heat generated by, and the location of the heat dispersed by, the heat transfer element 223.

The heat transfer element 223 may be used to generate either a secondary plasma or a burn region within the exhaust conduit 110. Both the generation of the secondary plasma and the burn region rely upon forming an electric current path passing from the inductive heating antenna 202, across the gasses and ions contained in the exhaust conduit to the heat transfer element 223, around or across the cylindrical area defined by the heat transfer element 223, and back across the gasses and ions contained in the exhaust conduit to the inductive heating antenna. The inductive heating antenna 202 applies thermal energy (heat) to within the exhaust conduit 110. The heat generated by the inductive heating antenna 202 to within the exhaust conduit 110 may be controlled depending upon the length of the electric current path. The closer the heat transfer element 223 is to the antenna 202, the shorter the electric path will be, and thus the more heat will be generated. Alternatively, the further the heat transfer element 223 is moved to the right, the longer the electrical path will be, and less heat will be generated. The heat transfer element 223 serves a movable liner for the conduit 110 to transfer heat to different portions of the conduit.

The inductive heating antenna 202 is provided at a first end 114 of the exhaust conduit. The inductive heating effects of the inductive heating antenna 202 are applied throughout the secondary plasma or the burn region 214. Therefore, the areas of the interior volume 126 remote from the antenna 202 (i.e., a second end 116 of the exhaust conduit 110) typically operate at a lower temperature than those areas closer to the antenna 202. This thermal gradient is especially pronounced when a plasma 103 is initiated within the semiconductor process chamber 102.

A time varying electric current passing through the inductive heating antenna 202 generates a magnetic flux in the secondary plasma 214 in the exhaust conduit 110. The magnetic flux operates based on Maxwell's equations. The RF source 220 controls the electric current flowing through the inductive heating antenna 202 under the direction of the controller 250. Such electric current control effects the magnetic flux (and the resultant electric current within the effluents) in the burn region 214. The electric current applied to the effluents can thereby be varied to produce a controllable heat in the burn region 214. The magnetic flux, in turn, generates an electric current in the secondary plasma 214 that applies heat to the gasses contained therein, and is used to ignite and/or maintain burning within the burn region 214.

Figure 4:
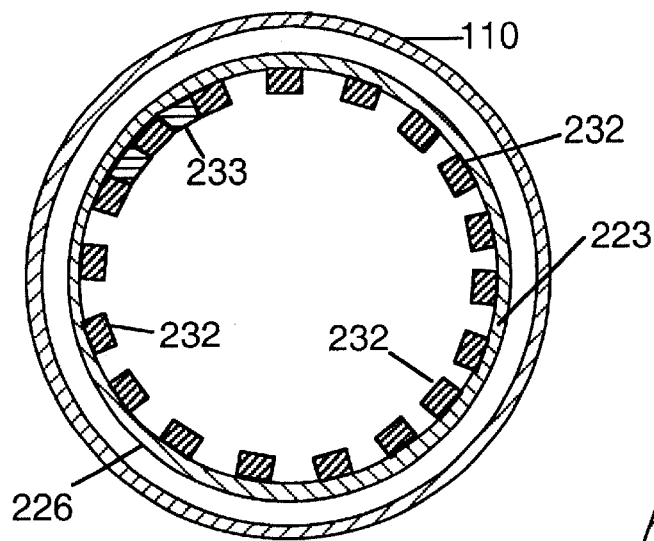
FIG. 4 shows a cross sectional view taken along section lines 4—4 of FIG. 2.
Figure 3:
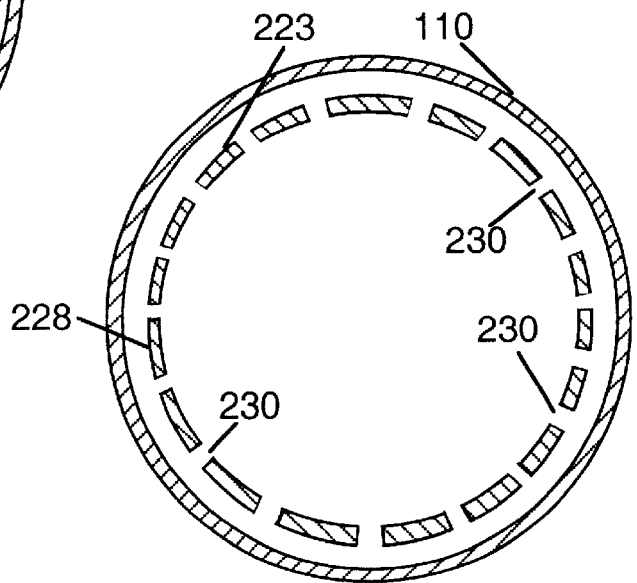
FIG. 3 shows a cross sectional view taken along section lines 3—3 of FIG. 2.

The heat transfer element 223 further comprises an array of ferromagnetic elements 232. Different cross-sectional views of the heat transfer element 223 are shown in FIGS. 3, 4, and 5. The heat transfer element 223 includes a first or low heat generation portion 226 and a second or high heat generation portion 228. The two heat generation portions 226, 228 have different heat generation characteristics when a similar magnetic field is applied. The two heat generation portions 226, 228 may be formed as a unitary structure. While two distinct heat generation portions 226, 228 are described, any practical number of heat generation portions may be provided. Each heat generation portion may have different heat generation characteristics and can be suitably positioned relative to the inductive heating antenna 202 within exhaust conduit 110 to provide the desired heat generation characteristics. The different heat generation portions of the heating element 223 thus provide for improved uniformity of heat distribution through an interior volume 126 and the conduit wall 124.

Slots 230 (shown in FIGS. 2 and 3) extend longitudinally through the low heat generation portion 226 of the heat transfer element 223. The slots 230 provide a discontinuity that limits the flow of eddy currents in the low heat generation portion 226 along the direction indicated by arrow 231 (perpendicular to the slots 230). The limited eddy current flow, decreases the heat generated within the low heat generation portion 226. The amount by which heat is generated can be altered as desired by changing the number or dimensions of slots 230, or angling the slots relative to the direction of the eddy current. In one embodiment, slots 230 are 0.125 to 0.25 inches wide and approximately 4 inches long. However, different dimensions and configurations of the slots 230 are within the scope of the invention.

The amount of heat generated by the heat transfer element 223 is controlled by its proximity to the inductive heating antenna 202. Temperature sensors 271 are positioned at one or more locations throughout the exhaust conduit 110 to determine the temperatures of the conduit walls and/or the interior of the exhaust conduit. The temperature sensors 271 are of any type generally known in the art. It may be preferred that the temperature sensors 271 be recessed within the conduit wall 124 to limit contact with the heat transfer element 223 when one of them is being relatively displaced. As many temperature sensors, 271 as desired, or found necessary, may be used based upon the configuration of the exhaust conduit 110. Though it is not shown in the drawings, the temperature sensors 271 may also be located on the heat transfer element 223 to provide more thermal information.

As shown in FIGS. 2 and 4, ferromagnetic elements 232 are physically coupled to the heat transfer element 223 in an orientation generally parallel to the heat transfer element 223. Locating the ferromagnetic elements 232 within the heat transfer element 223 in the high heat generation portion 228 is desired to maximize and evenly distribute the heat generated by the inductive heating antenna 202, and the secondary plasma or burn region along the length of the exhaust conduit 110. The ferromagnetic elements 232 are positioned in locations where large amounts of heat are needed. The ferromagnetic elements 232 comprise, for example, pieces of iron. The iron material are formed from minute magnetic dipoles that oscillate with time as a result of RF current. In one embodiment, the ferromagnetic elements are 0.025 inches wide, 3 inches long, and 0.25 inches thick.

Characteristics of the heat transfer element 223 that effect the amount of heat generated by the heat transfer element 223 include the permeability of the medium and the permeability ($\mu_r$) of the material forming the heat transfer element 223. If $\mu_r$ is much greater than one, then a hysteresis loss in the material of the ferromagnetic elements 232 occurs when the material is exposed to varying magnetic fields. The varying magnetic fields are generated when RF power 220 is applied to the inductive turns 216 of the inductive heating antenna 202. The hysteresis loss in the material of the ferromagnetic elements 232 results in the generation of heat. Optionally, non-magnetic strips 233 are provided to improve thermal transfer characteristics in the high heat generation portion 228 between the ferromagnetic elements 232 and the heat transfer element 223.

FIG. 5 shows a cross sectional view of an alternate embodiment of high heat generation portion 228 of the present invention from the embodiment shown in FIG. 4. The embodiment shown in FIG. 5 is configured to enhance the eddy current flow generated between the ferromagnetic elements 232 and the heat transfer element 223. In this embodiment, holes or recesses 270 are formed or machined in the heat transfer element 223 such that interfitting ferromagnetic elements 232 can be positioned within the holes 270. The holes 270 extend axially through the heat transfer element 223 and perpendicular to the direction of the generated eddy current. The holes 270 increase the distance that the eddy currents must travel, thereby increasing both the resistance of, and the heat generated within, the high heat generation portion 228.

While ferromagnetic elements 232 have relatively good heat generation characteristics in response to the induced magnetic flux generated by the inductive heating antenna 202 across the secondary plasma or burn region, they do have relatively poor thermal conductive characteristics. The heat transfer element 223 is formed from non-magnetic material and is selected for its electrical conductivity and its low thermal conductivity (e.g., stainless steel). Having a heat transfer element 223 with low thermal conductivity limits heat transfer between the high heat generation portion 228 and the low heat generation portion 226.

The heat transfer element 223 is configured to distribute heat to the interior volume 126 of the exhaust conduit 110 to enhance the abatement or conversion into a more acceptable form of the unconsumed gasses or effluent. To enhance the break-down and abatement or consumption of the gasses, a burn region 214 is established in the exhaust conduit 110. That is, unconsumed gasses, effluents, PFCs, and other particulates may be abated in either a secondary plasma or by heat in the burn region 214. In a secondary plasma, a thermal reaction occurs within a vacuum and an applied electromagnetic field to consume or abate the gasses. The vacuum is generated in the secondary plasma by the action of the second series pump 106. In a thermal application, unconsumed gasses or effluents are consumed or abated under the application of heat.

If the material in a portion of heat transfer element 223 that a magnetic flux is being applied is continuous (does not have material discontinuities such as slots 230), then a relatively larger eddy current is generated through that material in the direction indicated by arrow 229. This eddy current generates a large amount of heat in the higher heat generation portion. The eddy currents generated in the induction secondary material in response to the inductive heating antenna 202 generally follow the equation:

$$P=I^2R$$

where P is the heat stored in the material of the heat transfer element 223 in joules, I is the value of the eddy current in amps, and R is the resistance of the material in ohms.

Though some heat is generated by the low heat generation portion 226 of the heat transfer element 223, the majority of the heat generated is produced by the high heat generation portion 228. The heat transfer element 223 is positioned remote from the inductive heating antenna 202 adjacent region 116 of the exhaust conduit 110. Thus, the heat transfer element 223 distributes the heat within the exhaust conduit 110 (including the conduit wall 124) more uniformly.

A heat generation control unit 250 is used in certain embodiments of the present invention to control the amount of heat generated by the heat transfer element 223. The heat generation control unit 250 includes a shifter device 252, a controller 254, a plurality of temperature sensors 271, and a power detector 258. A linkage arm 268 is mechanically coupled between the shifter device 252 and heat transfer element 223 to move the heat transfer element 223 longitudinally along the conduit (i.e., in the direction of arrows 253). Shifter device 252 may be mounted within the wall to limit passage of heat through the junction of the shifter device 252 and the wall. Also, the shifter device 252 may extend through an end of the exhaust conduit (not shown) in such a manner that the linkage arm may displace the heat transfer element 223 longitudinally within the conduit. Thus, the control of the heat generated by the heat transfer element 223 depends upon shifting the heat transfer element 223 to the right or to the left, as shown in FIG. 2, to generated less or more heat, respectfully.

During operation, the shifter device 252 may move the heat transfer element 223 close to the inductive heating antenna 202 for a sufficient period to expose the heat transfer element 223 to sufficient electromagnetic radiation to generate a desired amount of heat. The heat transfer element 223 then can then be moved to a cooler portion of the exhaust system 100 (e.g. to the right in the embodiment shown in FIG. 2) to dispense the absorbed and/or generated heat contained therein.

As described above, the closer the heat transfer element 223 is to the inductive heating antenna 202 the greater the magnetic flux density applied and the greater the heat generation characteristics of the secondary plasma or burn region 214. However, the heat transfer element 223 can also be moved to distribute the heat between different portions of the exhaust conduit 110 based upon the relative temperature of the different portions to make the temperature of the different portions more uniform. Movement of the heat transfer element 223 is a relatively complex motion that is best determined and controlled by the heat generation control unit 250.

The embodiment shown in FIG. 2 depicts a shifter device 252 controlled by the controller 254 that controls heat generated by the heat transfer element 223. It is also within the scope of the invention to have a human operator displace the shifter device manually by applying force to a linkage extending through the exhaust conduit 110. This manual positioning of the heat transfer element 223 relies upon the skill and knowledge of the operator in accurately positioning the heat transfer element 223 based upon existing temperatures in the exhaust conduit 110. The operator would follow the logic outlined in FIG. 6, as described below.

The controller 254 includes central processing unit (CPU) 260, memory 262, circuit portion 265, input output interface (I/O) 264, and bus 266. The controller 254 controls operation of the shifting device 252 by comparing temperature of the interior of the exhaust conduit 110 as derived from temperature sensors 271 with desired values input from circuit portion 265 and memory 262. The CPU 260 performs the processing and arithmetic operations for the controller 254. CPU 260 is preferably of a type produced by Intel, Motorola, Texas Instruments, Advanced Micro Devices, or other such companies and whose operations is generally known to those skilled in the art. The memory 262 includes random access memory (RAM) and read only memory (ROM) that together store the computer programs, operands, operators, dimensional values, system processing temperatures and configurations, and other necessary parameters for controlling the operation of the exhaust conduit 110. For example, the programs may be stored as ASIC permanently integrated into the controller circuits, or can be provided on a computer readable medium such as a diskette, magnetic tape or the like and read into the memory when temperature monitoring is required. The bus 266 provides for digital information transmissions between CPU 260, circuit portion 265, memory 262, and I/O 264, and also connects I/O 264 to the portions of the exhaust conduit 110 that either receive digital information from, or transmit digital information to, controller 254 (such as the shifter device 252 and the temperature sensors 271).

I/O 264 provides an interface to control the transmissions of digital information between each of the components in controller 254. I/O 264 also provides an interface between the components of the controller 254 and different portions of the exhaust conduit 110. Controller 254 can process information relating to the conduit to the circuit portion 265, for example. Circuit portion 265 comprises all of the other user interface devices (such as display and keyboard), system devices, and other accessories associated with the controller 254. It is noted that while one embodiment of digital controller 254 is described herein, other digital controllers as well as analog controllers could function well in this application, and are within the intended scope of the present invention.

If the secondary plasma is increased in size within the interior volume, then the unconsumed gasses or effluents passing through the secondary plasma will be exposed for more time, thus maintaining the molecules of the unconsumed gasses or effluent discharged from the semiconductor process chamber in a dissociated state as they pass through the secondary plasma 214. The greater the volume within the interior volume 126 that is of a temperature and condition sufficient to dissociate the unconsumed gasses or effluent, the more complete the reaction of the fluorocarbons. The more complete the reaction of the fluorocarbons, the easier will be the abatement of the fluorocarbon molecules into another form. This abatement of the fluorocarbon molecules may occur at a lower temperature than if the fluorocarbons are not dissociated. Therefore, the temperature of the secondary plasma may be reduced below the temperature necessary to abate or convert the PFCs when they are not dissociated.

A temperature gradient will typically form between conduit wall 124 and interior volume 126. This temperature gradient exists because the ambient temperature outside the exhaust conduit 110 is less than the temperature of the interior volume 126 of the exhaust conduit 110. As the temperature of the conduit wall increases and approaches the temperature of the interior, this thermal gradient will be decreased. The secondary plasma is configured to enhance the thermal uniformity within the exhaust conduit. Thermal energy contained in the unconsumed gasses is applied to interior volume 126 of the exhaust conduit 110 when the semiconductor process chamber 102 is operating.

The unconsumed gasses and effluents released from the semiconductor process chamber 102 are usually not efficiently consumed when the interior volume 126 and the conduit wall 124 are cool (below 300° C. for certain fluorocarbons under certain circumstances) since the fluorocarbon molecules dissociated by the secondary plasma 214 may recombine. The combined fluorocarbons tend to form on the conduit wall 124. Such recombined fluorocarbons are more difficult to abate than dissociated fluorocarbons.

One embodiment of the exhaust gasses expelled into the exhaust conduit 110 in the embodiment shown in FIG. 1 comprise mixed PFCs and oxygen (e.g. $C_2F_6$, $C_2F_4$, and $C_4F_8$ and $O_2$) molecules. Oxygen is supplied to the exhaust conduit 110 via oxygen supply 290. Many PFCs and oxygen are dissociated under the influence of the secondary plasma 214. Purely thermal reactions between PFCs and oxygen molecules require a temperature of 1500° K, at which $C_2F_6$ is converted directly into $CO_2$ and other gasses that can be more easily abated. Considerable thermal energy must be applied to the exhaust conduit to raise the temperature to 1500° K. Thermal combustion or abatement of $C_2F_6$, for example, can occur at a lower temperature (e.g. 800° C.) when the PFC molecules are contained in a plasma. The increased secondary plasma size enhances the abatement of the PFCs at lower temperatures by limiting the recombination of the PFCs. The larger burn region 214 also provides more time that the unconsumed gasses or effluents are exposed to raised temperatures as they pass through the burn region. The more time that PFCs are exposed to raised temperature, the more completely the PFCs, unconsumed gasses, or effluents will likely be consumed. With the conduit walls proximate to the heat transfer element 223, the exhaust conduit walls are sufficient to limit the recombination of the unconsumed gasses on the exhaust conduit walls 110. For example, using $C_2F_6$ as the PFC, 300° C. has been found adequate to limit this recombination on the surface of the conduit walls 110.

Figure 6:
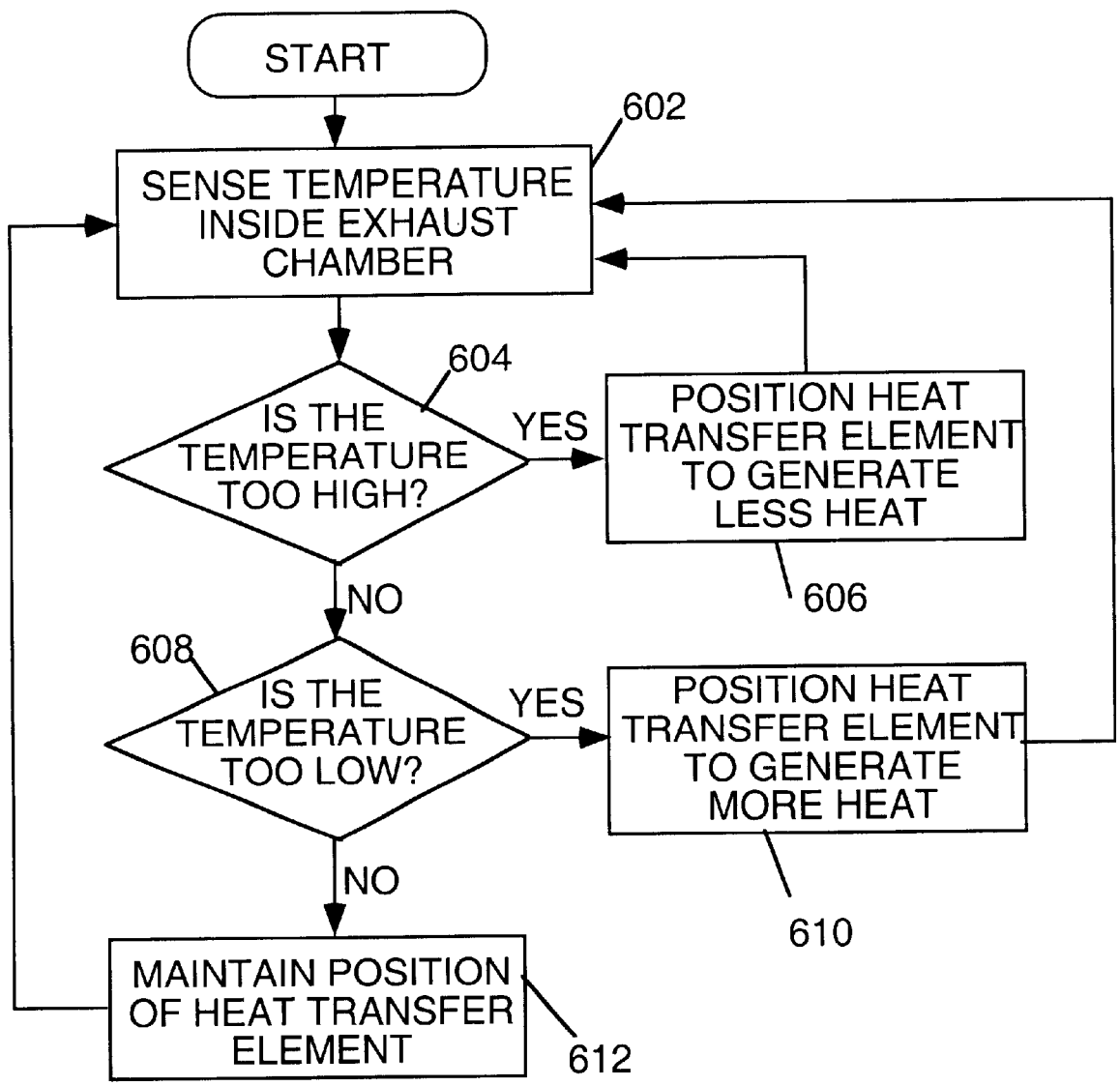
FIG. 6 shows one embodiment of a method performed by the controller shown in FIG. 2.

One embodiment of a method 600 for conducting combustion of effluent in an exhaust conduit is shown in FIG. 6. The method 600 starts with block 602 in which a temperature inside the exhaust conduit 110 is determined, for example, temperature sensors 271 provide data values to the controller 254. The method 600 continues to decision block 604 in which a determination of whether the temperature (inside the exhaust conduit 110) is too high is made. If the answer to decision block 604 is YES, the method continues to block 606 in which the heat transfer element 223 is incrementally moved (to the right in the embodiment shown in FIG. 2) to a position to generate less heat. Following block 606, the method 600 return to block 602. If the answer to decision block 604 is NO, the method 600 continues to decision block 608.

In decision block 608, a determination of whether the temperature inside the exhaust conduit 110 is too low is made. If the answer to decision block 608 is YES, the method 600 continues to block 610 in which the heat transfer element 223 is incrementally moved (to the left in the embodiment shown in FIG. 2) so that the heat transfer element 223 generates more heat. Following block 610, the method 600 returns to block 602. If the answer to decision block 608 is NO, the method 600 continues to block 612 in which the position of the heat transfer element 223 is maintained because the heat contained in the exhaust conduit 110 is within the desired range. Following block 612, the method 600 returns to block 602. The controller continually loops through method 600 (one every ten seconds for example) until temperature monitoring is no longer required (e.g., when wafer processing is halted).

During any of the blocks outlined in FIG. 6, the heat transfer element 223 may be displaced to equalize the heat contained within the different positions of the heat conduit 110. Additionally, the heat transfer element 223 may be displaced to a location where it generates more or less heat. These displacements to dissipate the desired heat in the different portions of the exhaust conduit thus have to be balanced with the displacements necessary to generate more or less heat within the heat transfer element 223.

Although various embodiments that incorporate the teachings of the present invention have been shown and described in detail herein, those skilled in the art can readily devise many other varied embodiments that still incorporate these teachings.

What is claimed is:

1. A heating system for an exhaust conduit of semiconductor processing system comprising:
    a heat transfer element disposed in the exhaust conduit; and
    a plurality of ferromagnetic elements in contact with said element.

2. The heating system set forth in claim 1, wherein the heat transfer element is fabricated of a non-magnetic material.

3. The heating system set forth in claim 2, wherein the non-magnetic material is selected from the group consisting of aluminum and stainless steel.

4. The heating system set forth in claim 1, wherein the heat transfer element further comprises:
    a low heat generation portion; and
    a high heat generation portion.

5. The heating system set forth in claim 4, wherein the low heat generation portion is a portion of the heat transfer element having a plurality of slots.

6. The heating system set forth in claim 5, wherein the plurality of slots are oriented in a substantially axial direction relative to the element.

7. The heating system set forth in claim 4, wherein the high heat generation portion is a portion of the heat transfer element having a plurality of recesses formed therein, the plurality of ferromagnetic elements disposed in the recesses.

8. The heating system set forth in claim 4, wherein the high heat generation portion is a portion of the heat transfer element wherein the plurality of ferromagnetic elements is disposed on an inner surface of the heat transfer element.

9. The heating system set forth in claim 1, further comprising a heater controller unit connected to the heat transfer element.

10. The heating system set forth in claim 9, wherein the heater controller unit further comprises a shifter device that controllably displaces the heat transfer element.

11. A semiconductor process system comprising:
    a process chamber;
    an exhaust conduit coupled to the process chamber; and
    a heating system disposed within said conduit.

12. The semiconductor process system set forth in claim 11 wherein the heating system further comprises:
    a heat transfer element disposed within the conduit; and
    a plurality of ferromagnetic elements disposed proximate said heat transfer element.

13. The semiconductor process system set forth in claim 12, wherein the heat transfer element is fabricated of a non-magnetic material.

14. The semiconductor process system set forth in claim 13, wherein the non-magnetic material is selected from the group consisting of aluminum and stainless steel.

15. The semiconductor process system set forth in claim 12, wherein the heat transfer element further comprises:
    a low heat generation portion; and
    a high heat generation portion.

16. The semiconductor process system set forth in claim 15, wherein the low heat generation portion is a portion of the heat transfer element having a plurality of slots.

17. The semiconductor process system set forth in claim 16, wherein the slots are oriented in a substantially axial direction relative to the element.

18. The semiconductor process system set forth in claim 12, wherein the heat transfer element has recesses formed therein, and the plurality of ferromagnetic elements are disposed in the recesses.

19. The semiconductor process system set forth in claim 12, wherein each of the plurality of ferromagnetic elements contacts an inner surface of the heating element.

20. The semiconductor process system set forth in claim 12, further comprising a heater controller unit connected to the heat transfer element.

21. The semiconductor process system set forth in claim 12, further comprising a shifter device that controllably shifts the heat transfer element along the conduit.

22. The semiconductor process system set forth in claim 21, wherein shifting of the heat transfer element adjusts an amount of heat generated by the heat transfer element.

23. Apparatus for effluent control in a semiconductor processing system having a process chamber and an exhaust pump, the apparatus comprising:
- an exhaust conduit disposed between the process chamber and the exhaust pump;
- a heat transfer element disposed in the exhaust conduit; and
- a coil disposed proximate the heat transfer element,
- wherein the heat transfer element is adapted for movement with respect to the coil for adjusting the temperature of the exhaust conduit and the effluent flowing therethrough.

24. The apparatus of claim 23 further comprising a shifter device connected to the heat transfer element.

25. The apparatus of claim 24 wherein the shifter device facilitates movement of the heat transfer element.

26. The apparatus of claim 25 wherein the coil exposes the heat transfer element to electromagnetic radiation which is converted into heat by the heat transfer element, said heat increases the temperature of the exhaust conduit and facilitates combustion of effluent flowing therethrough.

27. The apparatus of claim 23, wherein the heat transfer element further comprises:
- a low heat generation portion; and
- a high heat generation portion,
- wherein the low heat generation portion is oriented closer to the coil than the high heat generation portion.

28. The apparatus of claim 27 wherein the low heat generation portion is a portion of the heat transfer element having a plurality of slots defined within the element.

29. The apparatus of claim 28 wherein the plurality of slots provide a discontinuity within the heat transfer element that limits eddy currents in the low heat generation portion caused by exposure of the heat transfer element to electromagnetic radiation from the coil.

30. The apparatus of claim 27 wherein the high heat generation portion is a portion of the heat transfer element having a plurality of ferromagnetic elements coupled thereto.

31. The apparatus of claim 30 wherein the plurality of ferromagnetic elements form magnetic dipoles when exposed to electromagnetic radiation from the coil.

32. The apparatus of claim 28 wherein the slots are oriented in an axial direction relative to the heat transfer element.

33. The apparatus of claim 30 wherein the heat transfer element has a plurality of recesses formed therein, and the plurality of ferromagnetic elements are disposed in the recesses.

34. The apparatus of claim 31 wherein the plurality of ferromagnetic elements is disposed on an inner surface of the heat transfer element.

35. The apparatus of claim 27 wherein movement of the heat transfer element away from the coil reduces the amount of heat generated by the heat transfer element and movement of the heat transfer element towards the coil increases the amount of heat generated by the heat transfer element.

36. A method of controlling heat in a semiconductor processing system having a process chamber, an exhaust pump and an exhaust conduit disposed therebetween, comprising the steps of:
- positioning a heat transfer element relative to a coil in a first position in the exhaust conduit; and
- displacing the heat transfer element to a second position in the exhaust conduit.

37. The method of claim 36 wherein the positioning step exposes the heat transfer element to the coil to generate heat in the heat transfer element.

38. The method of claim 36 wherein the displacing step moves the heated heat transfer element to a portion of the exhaust conduit that requires additional heat.

39. The method set forth in claim 36, wherein the step of displacing the heat transfer element to the second position further comprises adjusting a heater controller unit.

* * * * *